US006444310B1

(12) United States Patent
Senoo et al.

(10) Patent No.: US 6,444,310 B1
(45) Date of Patent: Sep. 3, 2002

(54) DICING TAPE AND A METHOD OF DICING A SEMICONDUCTOR WAFER

(75) Inventors: Hideo Senoo; Takeshi Kondo, both of Saitama (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 09/371,101

(22) Filed: Aug. 10, 1999

(30) Foreign Application Priority Data

Aug. 10, 1998 (JP) .......................................... 10-226009

(51) Int. Cl.$^7$ .............................. C09J 7/02; B28D 5/00; H01L 21/68
(52) U.S. Cl. ...................... 428/354; 428/343; 156/257; 156/268; 156/211; 156/250
(58) Field of Search .................................. 428/354, 343, 428/345; 156/250, 257, 268, 211

(56) References Cited

U.S. PATENT DOCUMENTS

| | | | |
|---|---|---|---|
| 5,149,586 A | * | 9/1992 | Ishiwata et al. ............. 428/354 |
| 5,281,473 A | * | 1/1994 | Ishiwata et al. ............. 428/354 |
| 5,525,422 A | * | 6/1996 | Spies et al. .................. 428/355 |
| 6,176,966 B1 | * | 1/2001 | Tsujimoto et al. ........... 156/344 |

FOREIGN PATENT DOCUMENTS

EP    0 298 448    1/1989

OTHER PUBLICATIONS

European Search Report.

* cited by examiner

Primary Examiner—Daniel Zirker
(74) Attorney, Agent, or Firm—Darby & Darby

(57) ABSTRACT

A dicing tape comprising a substrate sheet and a pressure-sensitive adhesive layer formed on one surface of the substrate sheet, wherein the substrate sheet comprises an upper layer in direct contact with the pressure-sensitive adhesive layer, an intermediate layer adjacent to the upper layer, and a lower layer adjacent to the intermediate layer, and an anti-extensibility (A) of the upper layer, an anti-extensibility (B) of the intermediate layer, and an anti-extensibility (C) of the lower layer satisfy the equation (I):

$$B<A \leq C \qquad (I),$$

the anti-extensibility being a product of a modulus of elasticity and a layer thickness, is disclosed. The present dicing tape can uniformly and sufficiently enlarge dicing lines without affect by a modulus of elasticity of a pressure-sensitive adhesive, and is rarely broken at the dicing lines.

8 Claims, 1 Drawing Sheet

DICING TAPE AND A METHOD OF DICING A SEMICONDUCTOR WAFER

BACKGROUND OF THE INVENTION

1. Field of the Invention

The present invention relates to a dicing tape and a method of dicing a semiconductor wafer wherein the dicing tape is used.

2. Description of the Related Art

In successive steps of manufacturing semiconductor chips, in a dicing step a dicing tape is used to fix a semiconductor wafer thereon, and the semiconductor wafer is then cut into individual chips. The dicing step is followed by expanding, picking-up and mounting steps.

In the expanding step, the dicing tape is expanded to thereby expand or extend the widths of dicing lines or cutting lines formed in the dicing step and thus enlarge the spacing of the chips. The purpose of enlarging the spacing of the chips in the expanding step is to enhance a recognizability of the chips and to prevent the chips from coming into contact with adjacent chips and being damaged, when picked up in the picking-up step.

Nowadays, in the expanding step an expanding apparatus is used to stretch the dicing tape. In such an expanding apparatus, a stretching amount and a torque applied to stretch are generally set at constant levels. It is extremely cumbersome to adjust the expanding apparatus by changing the stretching amount or the torque, each time a type of dicing tape to be treated is changed, or a size of a semiconductor wafer attached to the dicing tape is changed.

Under the above circumstances, when a substrate material of a dicing tape stretched on the expanding apparatus has a high ductility, a stretching stress is not conveyed to an area where a semiconductor wafer is attached, and thus the spacing of the chips is not sufficiently enlarged. To the contrary, when a substrate material of a dicing tape being stretched has a low ductility, a stretching torque applied by the expanding apparatus becomes insufficient, the spacing of the chips is nonuniformly enlarged, or the dicing tapes may be broken.

Japanese Patent Laid-open Publication (Kokai) No. 8-124881 discloses a dicing tape having a three-layered construction; a pressure-sensitive adhesive layer as an uppermost layer, an intermediate sheet layer having a low ductility, and a base layer having a high ductility. Nevertheless, when said three-layered dicing tape is used in a conventional manner, dicing lines are not formed in a peripheral area around the central portion where a semiconductor wafer is attached. The peripheral area is also stretched together with the central portion where dicing lines are formed, and therefore, a stretching torque applied by the expanding apparatus becomes insufficient, or in some cases the dicing tapes may be broken.

As a pressure-sensitive adhesive coated on a surface of a dicing tape, not only general-purpose pressure-sensitive adhesives, but also ultraviolet (UV)-curable pressure-sensitive adhesives are widely used. A general-purpose pressure-sensitive adhesive has a modulus of elasticity of $10^4$ to $10^6$ $N/m^2$, whereas a modulus of elasticity of an UV-curable pressure-sensitive adhesive is raised to $10^7$ to $10^9$ $N/m^2$, after irradiation with ultraviolet rays. When the pressure-sensitive adhesive has a high modulus of elasticity, it deforms slightly when thrust upward by a thrusting needle in the picking-up step, and the picking-up procedure can be shortened, and thus, pollution of a back surface of a chip is reduced. However, an expanding apparatus is required to have a high torque for enlarging the spacing of the chips. When the pressure-sensitive adhesive has a low modulus of elasticity, a stress applied to a dicing tape in the expanding step is relaxed by a deformation of the pressure-sensitive adhesive, and thus the stress is not sufficiently conveyed to the dicing lines, and therefore, a sufficient spacing of the chips is not obtained.

SUMMARY OF THE INVENTION

Accordingly, the object of the present invention is to remedy the defects in prior art, and provide a dicing tape which can uniformly and sufficiently enlarge dicing lines without affect by a modulus of elasticity of a pressure-sensitive adhesive, and is rarely broken at the dicing lines.

Another object of the present invention is to provide a method of dicing a semiconductor wafer wherein the dicing tape is used.

Other objects and advantages will be apparent from the following description.

In accordance with the present invention, there is provided a dicing tape comprising a substrate sheet and a pressure-sensitive adhesive layer formed on one surface of the substrate sheet, wherein the substrate sheet comprises an upper layer in direct contact with the pressure-sensitive adhesive layer, an intermediate layer adjacent to the upper layer, and a lower layer adjacent to the intermediate layer, and an anti-extensibility (A) of the upper layer, an anti-extensibility (B) of the intermediate layer, and an anti-extensibility (C) of the lower layer satisfy the equation (I):

$$B < A \leq C \tag{I},$$

the anti-extensibility being a product of a modulus of elasticity and a layer thickness.

Preferably, the anti-extensibility (A) of the upper layer, the anti-extensibility (B) of the intermediate layer, and the anti-extensibility (C) of the lower layer satisfy the equation (I):

$$B < A \leq C \tag{I},$$

and at the same time further satisfy the equations (II) and (III):

$$0.4 \leq A/C \leq 1 \tag{II},$$

and $$B/C \leq 0.5 \tag{III}.$$

In a preferable embodiment of the present invention, the upper layer comprises two or more sublayers, and a whole anti-extensibility (A) of the upper layer is a sum of a product of a modulus of elasticity and a layer thickness of each sublayer constituting the upper layer.

In another preferable embodiment of the present invention, the lower layer comprises two or more sublayers, and a whole anti-extensibility (C) of the lower layer is a sum of a product of a modulus of elasticity and a layer thickness of each sublayer constituting the lower layer.

Further, in accordance with the present invention, there is provided a method of dicing a semiconductor wafer into individual chips which comprises:

(a) attaching the semiconductor wafer to a pressure-sensitive adhesive layer formed on one surface of a substrate sheet of a dicing tape wherein the substrate sheet comprises an upper layer in direct contact with the pressure-sensitive adhesive layer, an intermediate layer adjacent to the upper layer, and a lower layer adjacent to the intermediate layer, and an anti-extensibility (A) of the upper layer, an anti-extensibility (B) of the intermediate layer, and an anti-extensibility (C) of the lower layer satisfy the equation (I):

$$B<A\leq C \qquad (I),$$

the anti-extensibility being a product of a modulus of elasticity and a layer thickness, and thereafter, (b) dicing the semiconductor wafer with a dicing blade in such a manner that the upper layer is completely cut through from a top surface to a back surface, the intermediate layer is partly cut from a top surface to an inner point therein, and the lower layer is not cut.

The term "modulus of elasticity" as used herein means a proportionality constant (E) in the proportionality:

$$T=E\epsilon$$

when the proportionality holds true between a stress (T) and a strain ($\epsilon$) in an extension deformation. The term "modulus of elasticity" is a constant also referred to as Young's modulus. The modulus of elasticity can be determined by carrying out a tensile test using a tensile tester and calculating from a resulting tensile strength and an extension chart. The tensile tester, TENSILON/UTM-4-100 (Orientec Corporation), was used to determine the actual values disclosed herein with regard to the modulus of elasticity.

The term "anti-extensibility" as used herein means a value obtained by multiplying a "modulus of elasticity" of a sheet material constituting a layer by a "thickness" of the sheet material constituting the layer. For example, the anti-extensibility of the upper layer is a value obtained by multiplying a "modulus of elasticity" of an upper layer by a "thickness" of the upper layer. When the upper or lower layer is composed of two or more sublayers, a sum of anti-extensibilities of sublayers constituting the upper or lower layer corresponds to an anti-extensibility of the whole upper or lower layer.

DESCRIPTION OF THE PREFERRED EMBODIMENTS

Figure 1:
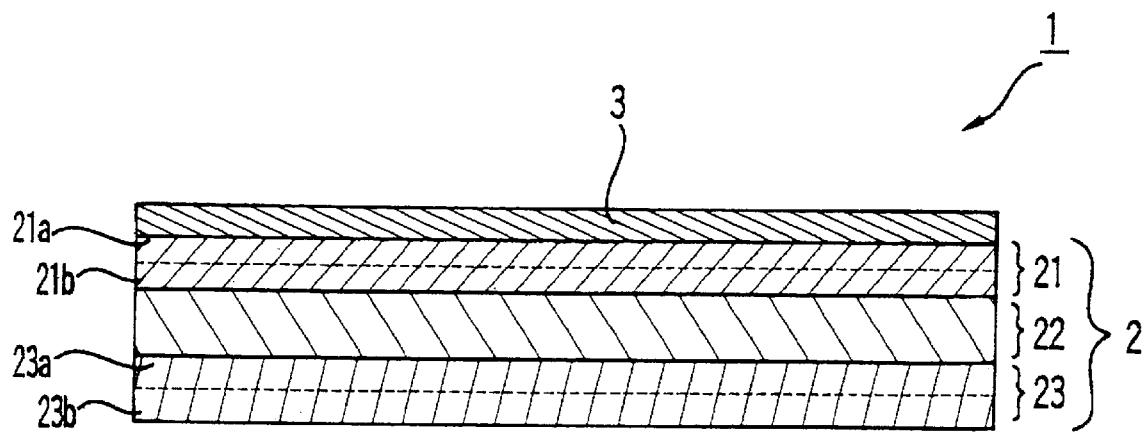
FIG. 1 is a sectional view schematically illustrating the dicing tape of the present invention.

The dicing tape of the present invention is preferably used in such a manner that the upper layer is completely cut through from a top surface to a back surface, the intermediate layer is partly cut from a top surface to an inner point within the intermediate layer, and the lower layer is not cut.

The dicing tape of the present invention will be explained hereinafter in detail referring to the drawings.

FIG. 1 schematically illustrates a sectional view of a basic embodiment of the dicing tape according to the present invention.

The dicing tape 1 as shown in FIG. 1 is composed of a substrate sheet 2 and a pressure-sensitive adhesive layer 3 coated on one surface of the substrate sheet 2. The substrate sheet 2 is composed of an upper layer 21, an intermediate layer 22, and a lower layer 23. As a whole, the dicing tape 1 has a four-layered structure wherein the pressure-sensitive adhesive layer 3, the upper layer 21, the intermediate layer 22, and the lower layer 23 are laminated in this sequence.

In the substrate sheet 2 of the dicing tape according to the present invention, at least one of the upper layer 21 or lower layer 23 may be composed of two or more sublayers, preferably 2 to 5 sublayers. For example, as shown by solid and dashed lines in FIG. 1, the substrate sheet 2 may consist of the upper layer 21 composed of a first upper sublayer 21a and a second upper sublayer 21b, the intermediate layer 22, and the lower layer 23 composed of a first lower sublayer 23a and a second lower sublayer 23b. At least one of the upper layer 21 and the lower layer 23 is preferably composed of two or more sublayers, as a thickness and/or an anti-extensibility of the dicing tape can be thus easily controlled.

Figure 2:
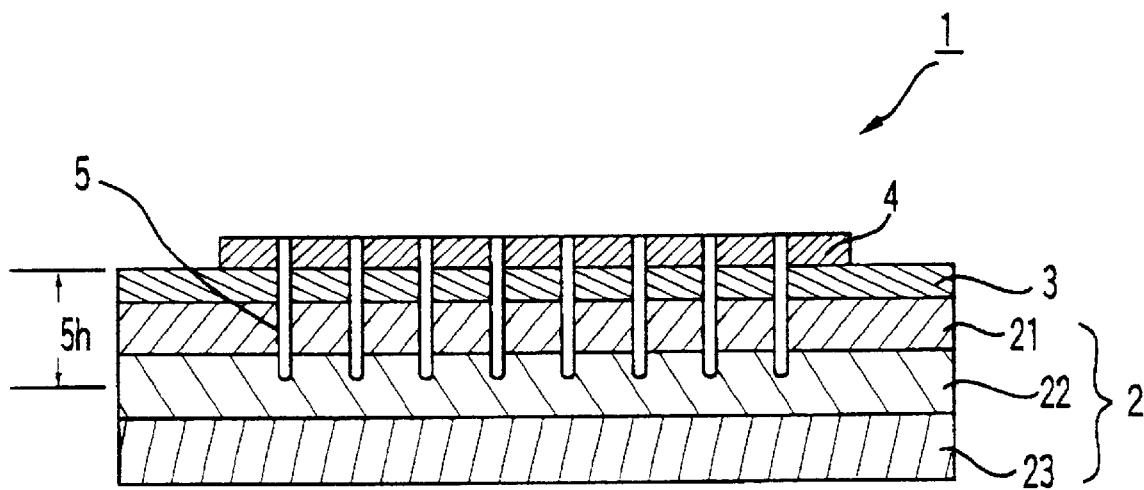
FIG. 2 is a sectional view schematically illustrating a condition wherein a semiconductor wafer is attached to the dicing tape of the present invention shown in FIG. 1, and dicing lines then formed.

When the dicing tape 1 as shown in FIG. 1 is used, a semiconductor wafer 4 is attached to the pressure-sensitive adhesive layer 3. Then, as shown in FIG. 2, the semiconductor wafer 4 is cut into individual chips with a dicing blade (not shown), and dicing lines are formed. In the cutting procedure, as shown in FIG. 2, the semiconductor wafer 4 is completely cut through from the top surface to the back or bottom surface. The pressure-sensitive adhesive layer 3 and the upper layer 21 are also completely cut through from the top surfaces to the back or bottom surfaces. The intermediate layer 22 arranged under the upper layer 21 is cut from the top surface to an inner point thereof, and the dicing lines 5 do not reach the lower layer 23 arranged under the intermediate layer 22.

When the upper layer 21 is composed of two or more sublayers, all the sublayers are completely cut through the top surfaces to the back surfaces thereof. When the lower layer 23 is composed of two or more sublayers, the dicing lines 5 are not formed in the sublayers.

As mentioned, an anti-extensibility (A) of the upper layer 21, an anti-extensibility (B) of the intermediate layer 22, and an anti-extensibility (C) of the lower layer 23 satisfy the equation (I):

$$B<A\leq C \qquad (I).$$

Preferably, the anti-extensibility (A) of the upper layer 21, the anti-extensibility (B) of the intermediate layer 22, and the anti-extensibility (C) of the lower layer 23 satisfy the equation (I):

$$B<A\leq C \qquad (I),$$

and at the same time satisfy the equations (II) and (III):

$$0.4\leq A/C\leq 1 \qquad (II),$$

and $$B/C\leq 0.5 \qquad (III).$$

In the dicing tape of the present invention, the anti-extensibility (A) of the upper layer 21 is more than the anti-extensibility (B) of the intermediate layer 22. If the anti-extensibility (A) of the upper layer 21 is not more than the anti-extensibility (B) of the intermediate layer 22, the upper layer 21 is easily deformed, and thus, a conveying of a force to the intermediate layer 22 is inhibited. Further, when the anti-extensibility (A) of the upper layer 21 is more than the anti-extensibility (C) of the lower layer 23, the dicing tape is easily broken due to the stress applied thereto during the expanding step.

When a ratio (A/C) of the anti-extensibility (A) of the upper layer 21 to the anti-extensibility (C) of the lower layer 23 is 0.4 or more, the strength of the layer where the dicing lines are not formed becomes more suitable, and thus, the dicing lines 5 can be more easily enlarged in the actual expanding step, using an expanding apparatus. When the ratio (A/C) is 1.0 or less, a breakage in the area where the dicing lines 5 are formed can be effectively avoided.

When a ratio (B/C) of the anti-extensibility (B) of the intermediate layer 22 to the anti-extensibility (C) of the lower layer 23 is 0.5 or less, the dicing lines 5 can be more uniformly enlarged in the actual expanding step, using an expanding apparatus.

The materials of the layers constituting the substrate sheet 2 in the dicing tape of the present invention are not particularly limited, so long as they provide anti-extensibilities satisfying the above equation (I), and further, optionally the above equations (II) and (III). Materials having an excellent water resistance and heat resistance are suitable, and synthetic resin films are particularly suitable.

The material for the layers of the substrate sheet 2 may be, for example, a film made of low-density polyethylene (LDPE), linear low-density polyethylene (LLDPE), ethylene-propylene copolymer, polypropylene, polybutene, polybutadiene, polymethylpentene, ethylene-vinyl acetate copolymer, ethylene (meth)acrylic acid copolymer, ethylene methyl (meth)acrylate copolymer, ethylene ethyl (meth)acrylate copolymer, polyvinyl chloride, vinyl chloride-vinyl acetate copolymer, ethylene-vinyl chloride-vinyl acetate copolymer, polyurethane, polyamide, ionomer, or styrene-butadiene rubber or a hydrogenolyzed or modified product thereof. When the upper layer 21 and/or the lower layer 23 are composed of two or more sublayers, the sublayers may be made of any materials, respectively, so long as the anti-extensibilities of the upper layer 21 and the lower layer 23 satisfy the above requirements.

In the dicing tape of the present invention, a thickness of the whole substrate sheet 2 is not limited, so long as the dicing method as detailed above can be carried out. Further, a thickness of each of the upper layer 21, the intermediate layer 22, and the lower layer 23 is not limited, so long as the respective layers 21, 22, 23 have thicknesses such that the upper layer 21 can be completely cut through from a top surface to a bottom surface thereof, the intermediate layer 22 can be partly cut from a top surface to an inner point within the intermediate layer, and the lower layer 23 is not cut in the dicing method as detailed above.

In general, a cutting depth ("5/h" in FIG. 2) of a dicing line formed in a dicing tape is about 10 $\mu$m to about 40 $\mu$m. Therefore, a thickness of the whole dicing tape of the present invention is preferably 20–500 $\mu$m, more preferably 50–250 $\mu$m. When the thickness of the whole dicing tape is 20 $\mu$m or more, the thicknesses of the respective layers can be easily controlled. When the thickness of the whole dicing tape is 500 $\mu$m or less, the production and the handling of the dicing tape becomes easier. The thickness of the intermediate layer 22 is preferably 5 $\mu$m or more, more preferably 10 $\mu$m or more, to ensure that a cutting tip or a cutting end stays within the intermediate layer 22, and does not reach the lower layer 23.

The pressure-sensitive adhesive layer 3 may be formed from various conventionally known pressure-sensitive adhesives. For example, pressure-sensitive adhesives based on rubber, acrylate, silicone, or polyvinyl ether may be used. A radiation (including ultraviolet) curable or a heat expandable adhesive also may be used. Further, a pressure-sensitive adhesive for both dicing and die-bonding steps may be used.

A thickness of the pressure-sensitive adhesive layer 3 may be 3–100 $\mu$m, preferably 10–50 $\mu$m.

The dicing tape 1 of the present invention may be manufactured by various methods. For example, the dicing tape 1 of the present invention may be manufactured by coating a pressure-sensitive adhesive composition on a release liner by means of a roll knife coater, a gravure coater, a die coater, or a reverse coater, which are in themselves known, or the like to form the pressure-sensitive adhesive layer after drying, laminating the resulting pressure-sensitive adhesive layer onto the substrate sheet 2, which has been separately prepared, and then removing the release liner. It is not necessary to remove the release liner until a semiconductor wafer 4 is attached to the dicing tape 1. The substrate sheet 2 may be manufactured by, for example, a co-extrusion process.

EXAMPLES

The present invention will now be further illustrated by, but is by no means limited to, the following Examples.

Example 1

In the present Example, a dicing tape 1 of the present invention was manufactured. In the dicing tape 1, a pressure-sensitive adhesive layer 3 was laminated on an upper layer 21 of a substrate sheet 2 composed of the upper layer 21, an intermediate layer 22 and a lower layer 23.

A pressure-sensitive adhesive used for forming the pressure-sensitive adhesive layer 3 was an acrylate-based and UV-curable pressure-sensitive adhesive prepared by blending 125 parts by weight of polyfunctional urethane acrylate, 1 part by weight of multifunctional isocyanate compound and 5 parts by weight of photopolymerization initiator to 100 parts by weight of a copolymer compound having a weight-average molecular weight of 500,000 and prepared from butyl acrylate/methyl methacrylate/2-hydroxyethyl acrylate (50 parts by weight/45 parts by weight/5 parts by weight).

As the upper layer 21, an ethylene methacrylic acid copolymer film (methacrylic acid content=9%) was used. Further, an ethylene-vinyl acetate copolymer film (vinyl acetate content=22%) as the intermediate layer 22, and an ethylene methacrylic acid copolymer film (methacrylic acid content=9%) as the lower layer were used. Table 1 shows the films, modulus of elasticity and layer thicknesses of the layers.

The dicing tape 1 of the present invention was prepared as follows: The film compositions as detailed above were co-extruded from a three-layer co-extruder to form a three-layer substrate sheet 2. The acrylate-based UV-curable pressure-sensitive adhesive diluted with toluene was coated on a release liner, using a roll knife coater, and dried at 100° C. for 1 minute to form the pressure-sensitive adhesive layer on the release liner. The pressure-sensitive adhesive layer was laminated on the upper layer 21 of the substrate sheet 2, and the release liner then removed to obtain the dicing tape 1. Table 3 shows the anti-extensibilities of the layers in the resulting dicing tape 1. The resulting dicing tape 1 was used in dicing methods as shown in Evaluation Examples 1 and 2 mentioned later to determine the spacing of the dicing lines formed in an expanding step. The results are shown in Tables 5 and 6.

Example 2

In the present Example, a dicing tape 1 of the present invention wherein a pressure-sensitive adhesive layer 3 was laminated on an upper layer 21 of a substrate sheet 2 was manufactured. The substrate sheet 2 was composed of an upper layer having two upper sublayers, an intermediate layer 22 and a lower layer 23 which layers were laminated in this sequence. The UV-curable pressure-sensitive adhesive used in Example 1 was used to form the pressure-sensitive adhesive layer 3. Table 1 shows the films, modulus of elasticity and layer thicknesses of the layers.

The dicing tape 1 of the present invention was manufactured by repeating the procedure described in Example 1, except that the film compositions were co-extruded from a four-layer co-extruder to form a four-layer substrate sheet 2. Table 3 shows the anti-extensibilities of the layers in the resulting dicing tape 1. The resulting dicing tape 1 was used in the dicing method as shown in Evaluation Example 1 mentioned later to determine the spacing of the dicing lines formed in an expanding step. The results are shown in Table 5.

Example 3

In the present Example, a dicing tape 1 of the present invention, wherein a pressure-sensitive adhesive layer 3 was laminated on an upper layer 21 of a substrate sheet 2, was manufactured. The substrate sheet 2 was composed of the upper layer 21, an intermediate layer 22 and a lower layer 23 having two lower sublayers. These layers were laminated in this sequence. The UV-curable pressure-sensitive adhesive used in Example 1 was used to form the pressure-sensitive adhesive layer 3. Table 1 shows the films, modulus of elasticity and layer thicknesses of the layers.

The dicing tape 1 of the present invention was manufactured by repeating the procedure described in Example 1, except that the film compositions were co-extruded from a four-layer co-extruder to form a four-layer substrate sheet 2. Table 3 shows the anti-extensibilities of the layers in the resulting dicing tape 1. The resulting dicing tape 1 was used in the dicing method as shown in Evaluation Example 1 mentioned later, to determine the spacing of the dicing lines formed in an expanding step. The results are shown in Table 5.

Example 4

In the present Example, a dicing tape 1 of the present invention wherein a pressure-sensitive adhesive layer 3 was laminated on an upper layer 21 of a substrate sheet 2 was manufactured. The substrate sheet 2 was composed of the upper layer 21, an intermediate layer 22 and a lower layer 23. These layers were laminated in this sequence.

A pressure-sensitive adhesive used for forming the pressure-sensitive adhesive layer 3 was an acrylate-based UV-curable pressure-sensitive adhesive prepared by blending 0.9 part by weight of multifunctional isocyanate compound and 0.9 part by weight of photopolymerization initiator to 100 parts by weight of a product which had been prepared by reacting 100 parts by weight of a copolymer compound having a weight-average molecular weight of 600,000 and prepared from butyl acrylate/methyl methacrylate/2-hydroxyethyl acrylate (85 parts by weight/5 parts by weight/10 parts by weight) and 8 parts by weight of methacryloyloxyethyl isocyanate.

Table 1 shows the films, modulus of elasticity and layer thicknesses of the layers.

Table 3 shows the anti-extensibilities of the layers in the resulting dicing tape 1. The resulting dicing tape 1 was used in the dicing method as shown in Evaluation Example 1 mentioned later to determine the spacing of the dicing lines formed in an expanding step. The results are shown in Table 5.

Example 5

In the present Example, the dicing tape 1 of the present invention having the same structure as that of the dicing tape obtained in Example 3 was manufactured by repeating the procedure described in Example 3, except that a pressure-sensitive adhesive used for forming the pressure-sensitive adhesive layer 3 was an acrylate-based pressure-sensitive adhesive prepared by blending 2 parts by weight of multifunctional isocyanate compound to 100 parts by weight of a copolymer compound having a weight-average molecular weight of 500,000 and prepared from butyl acrylate/methyl methacrylate/2-hydroxyethyl acrylate (75 parts by weight/20 parts by weight/5 parts by weight).

Table 1 shows the modulus of elasticity and layer thicknesses of the layers. Table 3 shows the anti-extensibilities of the layers. The resulting dicing tape 1 was used in the dicing method as shown in Evaluation Example 1 mentioned later to determine the spacing of the dicing lines formed in an expanding step. The results are shown in Table 5.

Comparative Example 1

In this Comparative Example, a comparative dicing tape was manufactured by repeating the procedure described in Example 1, except that a substrate sheet was made only of an ethylene-methacrylate copolymer film (methacrylate content=9%). Table 2 shows the modulus of elasticity and layer thicknesses of the layers. Table 4 shows the anti-extensibility of the substrate sheet of the resulting dicing tape. The resulting dicing tape 1 was used in the dicing method as shown in Evaluation Example 1 mentioned later to determine the spacing of the dicing lines formed in an expanding step. The results are shown in Table 5.

Comparative Example 2

A comparative dicing tape was manufactured by repeating the procedure described in Comparative Example 1, except that the UV-curable pressure-sensitive adhesive used in Example 4 was used. Table 2 shows the modulus of elasticity and layer thicknesses of the layers. Table 4 shows the anti-extensibility of the substrate sheet of the resulting dicing tape. The resulting dicing tape 1 was used in the dicing methods as shown in Evaluation Examples 1 and 2 mentioned later to determine the spacing of the dicing lines formed in an expanding step. The results are shown in Tables 5 and 6.

In the following Table 1, the modulus of elasticity in Examples 1 to 4 are those obtained after irradiated with an UV light.

TABLE 1

| | | Substrate sheet | | | | | |
|---|---|---|---|---|---|---|---|
| | | Pressure-sensitive adhesive layer | Upper layer | | Intermediate layer | Lower layer | |
| Examples | Items | | First upper sublayer | Second upper sublayer | | First lower sublayer | Second lower sublayer |
| 1 | Composition | Acrylate-based UV-curable | Ethylene methacrylic acid copolymer (methacrylic acid content = 9%) | | Ethylene vinyl acetate copolymer (vinyl acetate content = 22%) | Ethylene methacrylic acid-copolymer (methacrylic acid content = 9%) | |
| | Modulus of elasticity (N/m$^2$) Thickness ($\mu$m) | $9.0 \times 10^8$ 10 | $1.4 \times 10^8$ 30 | | $3.2 \times 10^7$ 30 | $1.4 \times 10^8$ 40 | |
| 2 | Composition | Acrylate-based UV-curable | Ethylene methacrylic acid copolymer (methacrylic acid content = 9%) | Blend of polypropylene and hydrogenated styrene-butadiene rubber | Hydrogenated styrene-butadiene rubber | Ethylene methacrylic acid copolymer (methacrylic acid content = 9%) | |
| | Modulus of elasticity (N/m$^2$) Thickness ($\mu$m) | $9.0 \times 10^8$ 10 | $1.4 \times 10^8$ 12 | $1.8 \times 10^8$ 8 | $2.8 \times 10^7$ 30 | $1.4 \times 10^8$ 50 | |
| 3 | Composition | Acrylate-based UV-curable | Ethylene methacrylic acid copolymer (methacrylic acid content = 9%) | | Hydrogenated styrene-butadiene rubber | Ethylene methacrylic acid copolymer (methacrylic acid content = 9%) | Soft polyvinyl chloride |
| | Modulus of elasticity (N/m$^2$) Thickness ($\mu$m) | $9.0 \times 10^8$ 10 | $1.4 \times 10^8$ 20 | | $2.8 \times 10^7$ 30 | $1.4 \times 10^8$ 10 | $1.0 \times 10^8$ 40 |
| 4 | Composition | Acrylate-based UV-curable | Ethylene methacrylic acid copolymer (methacrylic acid content = 9%) | | Ethylene methylene methacrylate copolymer (methyl methacrylate content = 5%) | Ethylene methacrylic acid copolymer (methacrylic acid content = 9%) | |
| | Modulus of elasticity (N/m$^2$) Thickness ($\mu$m) | $1.2 \times 10^7$ 10 | $1.4 \times 10^8$ 30 | | $1.0 \times 10^8$ 25 | $1.4 \times 10^8$ 40 | |
| 5 | Composition | Acrylate-based | Ethylene methacrylic acid copolymer (methacrylic acid content = 9%) | | Hydrogenated styrene-butadiene rubber | Ethylene methacrylic acid copolymer (methacrylic acid content = 9%) | Soft polyvinyl chloride |
| | Modulus of elasticity (N/m$^2$) Thickness ($\mu$m) | $8.0 \times 10^5$ 10 | $1.4 \times 10^8$ 20 | | $2.8 \times 10^7$ 30 | $1.4 \times 10^8$ 10 | $10 \times 10^8$ 40 |

TABLE 2

| | | Pressure-sensitive adhesive layer | Substrate sheet |
|---|---|---|---|
| Comparative Example 1 | Modulus of elasticity (N/m$^2$) Thickness ($\mu$m) | $9.0 \times 10^8$ 10 | $1.4 \times 10^8$ 100 |
| Comparative Example 2 | Modulus of elasticity (N/m$^2$) Thickness ($\mu$m) | $1.2 \times 10^7$ 10 | $1.4 \times 10^8$ 100 |

The modulus of elasticity in Comparative Examples 1 and 2 are those obtained after irradiated with an UV light.

TABLE 3

| | Anti-extensibility (N/m) | | | | |
|---|---|---|---|---|---|
| | Upper layer (A) | Intermediate layer (B) | Lower layer (C) | A/C | B/C |
| Example 1 | $4.2 \times 10^3$ | $9.6 \times 10^2$ | $5.6 \times 10^3$ | 0.75 | 0.17 |
| Example 2 | $3.1 \times 10^3$ | $8.4 \times 10^2$ | $7.0 \times 10^3$ | 0.45 | 0.12 |
| Example 3 | $2.8 \times 10^3$ | $8.4 \times 10^2$ | $5.4 \times 10^3$ | 0.52 | 0.16 |
| Example 4 | $4.2 \times 10^3$ | $2.5 \times 10^3$ | $5.6 \times 10^3$ | 0.625 | 0.45 |
| Example 5 | $2.8 \times 10^3$ | $8.4 \times 10^2$ | $5.4 \times 10^3$ | 0.52 | 0.16 |

TABLE 4

| | Anti-extensibility (N/m) Substrate sheet |
|---|---|
| Comparative Example 1 | $14 \times 10^3$ |
| Comparative Example 2 | $14 \times 10^3$ |

Evaluation Example 1: Measurement of Widths of Dicing Lines (1)

Widths of dicing lines were measured by the following procedure.

A semiconductor wafer (diameter=6 inches) was attached on each of five dicing tapes manufactured in Examples 1 to 5 or two dicing tapes manufactured in Comparative Examples 1 and 2. The semiconductor wafer was cut by a dicing blade (width=30 $\mu$m) to obtain individual chips (10 mm×10 mm). The cutting was carried out so that the cutting depth "5$h$" completely passed through the upper layer 21, but stopped midway of the intermediate layer 22. Specifically, the cutting depth "5$h$" of the dicing lines was 50 $\mu$m in the case of the dicing tapes manufactured in Examples 1 and 4, 40 $\mu$m in the case of the dicing tapes manufactured in Examples 2, 3 and 5, and 40 $\mu$m in the case of the dicing tapes manufactured in Comparative Examples 1 and 2. Thereafter, the dicing tapes manufactured in Examples 1 and 4 and Comparative Examples 1 and 2 were irradiated with ultraviolet rays, to lower the adhesive strength of the pressure-sensitive adhesive layer. Then, the expanding procedure was carried out so that the peripheral edge of the dicing tape was stretched downward by 12 mm from a dicing frame, as an expanded amount, using Bonder-CPS-100 (Nichiden Machinery, Ltd.).

After the expanding treatment, widths of the dicing lines were measured at various points in the peripheral area and the central area on the semiconductor wafer. The measurement at each point was conducted for two orthogonal directions. Hereinafter, one direction is referred to as "direction x", and the other direction crossing at right angles thereto is referred to as "direction y". The results are shown in Table 5. In Table 5, a unit of a width of the dicing lines is $\mu$m. The widths of the dicing lines before expansion were the same as the width of the dicing blade used, i.e., 30 nm in the directions x and y.

As apparent from Table 5, it was confirmed that the dicing lines in the comparative dicing tape manufactured in Comparative Example 1 were not sufficiently enlarged, and those in the comparative dicing tape manufactured in Comparative Example 2 were nonuniformly enlarged, whereas a uniform and sufficient spacing of the chips were obtained in the dicing tapes of the present invention without an affect the modulus of elasticity of the pressure-sensitive adhesives.

TABLE 5

| Dicing tape | Widths of dicing lines | | | |
| --- | --- | --- | --- | --- |
| | Peripheral area of semiconductor wafer Directions | | Central area of semiconductor wafer Directions | |
| | x | y | x | y |
| Example 1 | 300 | 350 | 310 | 350 |
| Example 2 | 420 | 350 | 370 | 330 |
| Example 3 | 530 | 550 | 550 | 600 |
| Example 4 | 220 | 250 | 200 | 300 |
| Example 5 | 320 | 400 | 350 | 420 |
| Comparative Example 1 | 80 | 90 | 80 | 90 |
| Comparative Example 2 | 130 | 110 | 180 | 650 |

(unit = $\mu$m)

Evaluation Example 2: Measurement of Widths of Dicing Lines (2)

The procedure described in Evaluation Example 1 was repeated to evaluate the dicing tapes manufactured in Example 1 and Comparative Example 1, except that Bonder-HS-1010 (HUGLE ELECTRONICS INC.) was used and the expansion amount was 30 mm. The results are shown in Table 6. The bonder used in this Example tends to provide narrower widths of the spacing of the chips than that provided by the bonder used in Evaluation Example 1. Therefore, the spacing of the chips was not sufficiently enlarged in the comparative dicing tape manufactured in Comparative Example 1, whereas a sufficient spacing of the chips was obtained in the present dicing tape manufactured in Example 1.

TABLE 6

| Dicing tape | Widths of dicing lines | | | |
| --- | --- | --- | --- | --- |
| | Peripheral area of semiconductor wafer Directions | | Central area of semiconductor wafer Directions | |
| | x | y | x | y |
| Example 1 | 170 | 210 | 180 | 200 |
| Comparative Example 1 | 40 | 30 | 40 | 30 |

As described, the present dicing tape can uniformly and sufficiently enlarge dicing lines without affect by a modulus of elasticity of a pressure-sensitive adhesive, and is rarely broken at the dicing lines.

Although the present invention has been described with reference to specific embodiments, various changes and modifications obvious to those skilled in the art are deemed to be within the spirit, scope, and concept of the invention.

What we claim is:

1. A dicing tape comprising a substrate sheet and a pressure-sensitive adhesive layer formed on one surface of said substrate sheet, wherein said substrate sheet comprises an upper layer in direct contact with said pressure-sensitive adhesive layer, an intermediate layer adjacent to said upper layer, and a lower layer adjacent to said intermediate layer, and an anti-extensibility (A) of said upper layer, an anti-extensibility (B) of said intermediate layer, and an anti-extensibility (C) of said lower layer satisfying the equation (I):

$$B < A \leq C \quad (I),$$

said anti-extensibility being a product of a modulus of elasticity and a layer thickness, wherein said upper layer comprises at least two sublayers, and the whole anti-extensibility (A) of said upper layer is a sum of the product of a modulus of elasticity and a layer thickness of each sublayer constituting said upper layer.

2. A dicing tape comprising a substrate sheet and a pressure-sensitive adhesive layer formed on one surface of said substrate sheet, wherein said substrate sheet comprises an upper layer in direct contact with said pressure-sensitive adhesive layer, an intermediate layer adjacent to said upper layer, and a lower layer adjacent to said intermediate layer, and an anti-extensibility (A) of said upper layer, an anti-extensibility (B) of said intermediate layer, and an anti-extensibility (C) of said lower layer satisfying the equation (I):

$$B < A \leq C \quad (I),$$

said anti-extensibility being a product of a modulus of elasticity and a layer thickness, wherein said lower layer comprises at least two sublayers, and the whole anti-extensibility (C) of said lower layer is a sum of the product of a modulus of elasticity and a layer thickness of each sublayer constituting said lower layer.

3. The dicing tape according to claim 1, wherein said anti-extensibility (A) of said upper layer, said anti-extensibility (B) of said intermediate layer, and said anti-extensibility (C) of said lower layer further satisfy the equations (II) and (III):

$$0.4 \leq A/C \leq 1 \quad (II),$$

and $$B/C \leq 0.5 \quad (III).$$

4. The dicing tape according to claim 2, wherein said anti-extensibility (A) of said upper layer, said anti-extensibility (B) of said intermediate layer, and said anti-extensibility (C) of said lower layer further satisfy the equations (II) and (III):

$$0.4 \leq A/C \leq 1 \tag{II}$$

and $$B/C \leq 0.5 \tag{III}$$

5. A method of dicing a semiconductor wafer into individual chips which comprises:

(a) attaching said semiconductor wafer to a pressure-sensitive adhesive layer formed on one surface of a substrate sheet of a dicing tape wherein said substrate sheet comprises an upper layer in direct contact with said pressure-sensitive adhesive layer, an intermediate layer adjacent to said upper layer, and a lower layer adjacent to said intermediate layer, and an anti-extensibility (A) of said upper layer, an anti-extensibility (B) of said intermediate layer, and an anti-extensibility (C) of said lower layer satisfy the equation (I):

$$B < A \leq C \tag{I}$$

said anti-extensibility being a product of a modulus of elasticity and a layer thickness, and thereafter, (b) dicing said semiconductor wafer with a dicing blade in such a manner that said upper layer is completely cut through from a top surface to a back surface, said intermediate layer is partly cut from a top surface to an inner point therein, and said lower layer is not cut.

6. The method according to claim 5, wherein said anti-extensibility (A) of said upper layer, said anti-extensibility (B) of said intermediate layer, and said anti-extensibility (C) of said lower layer further satisfy the equations (II) and (III):

$$0.4 \leq A/C \leq 1 \tag{II}$$

and $$B/C \leq 0.5 \tag{III}$$

7. The method according to claim 5, wherein said upper layer comprises two or more sublayers, and a whole anti-extensibility (A) of said upper layer is a sum of a product of a modulus of elasticity and a layer thickness of each sublayer constituting said upper layer.

8. The method according to claim 5, wherein said lower layer comprises two or more sublayers, and a whole anti-extensibility (C) of said lower layer is a sum of a product of a modulus of elasticity and a layer thickness of each sublayer constituting said lower layer.

* * * * *